(12) United States Patent
Zhang et al.

(10) Patent No.: US 12,052,825 B2
(45) Date of Patent: Jul. 30, 2024

(54) FLEXIBLE CIRCUIT STRUCTURE FOR CIRCUIT LINE BENDING

(71) Applicant: International Business Machines Corporation, Armonk, NY (US)

(72) Inventors: Hongqing Zhang, Hopewell Junction, NY (US); Guoda Lian, Poughkeepsie, NY (US); Shidong Li, Hopewell Junction, NY (US); Junjun Li, Pleasant Valley, NY (US); Zhigang Song, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 10 days.

(21) Appl. No.: 17/355,672

(22) Filed: Jun. 23, 2021

(65) Prior Publication Data

US 2022/0418110 A1    Dec. 29, 2022

(51) Int. Cl.
*H05K 1/18* (2006.01)
*H05K 1/02* (2006.01)
*H05K 1/11* (2006.01)

(52) U.S. Cl.
CPC ............. *H05K 1/189* (2013.01); *H05K 1/028* (2013.01); *H05K 1/118* (2013.01)

(58) Field of Classification Search
CPC .......... H05K 1/028; H05K 1/18; H05K 1/189; H05K 1/118
USPC ........................................................ 174/254
See application file for complete search history.

(56) References Cited

U.S. PATENT DOCUMENTS

| | | | |
|---|---|---|---|
| 8,576,537 B2 | 11/2013 | Prymak | |
| 8,615,950 B1 | 12/2013 | Gomes | |
| 8,713,770 B2 | 5/2014 | Prymak | |
| 9,260,174 B1 | 2/2016 | Safai | |
| 9,818,770 B2 | 11/2017 | Huitema | |
| 9,885,184 B2 | 2/2018 | Gomes | |
| 10,056,443 B2 | 8/2018 | Shyu | |
| 10,084,310 B1 | 9/2018 | Neely | |
| 2010/0097739 A1 | 4/2010 | Prymak | |
| 2011/0252614 A1 | 10/2011 | Prymak | |
| 2017/0003768 A1 | 1/2017 | Zhang | |
| 2017/0037638 A1 | 2/2017 | Gomes | |
| 2022/0157697 A1* | 5/2022 | Taneda | H01L 23/5387 |
| 2022/0304164 A1* | 9/2022 | Özkök | H01L 21/486 |
| 2022/0413653 A1* | 12/2022 | Kim | H10K 59/40 |

FOREIGN PATENT DOCUMENTS

| | | |
|---|---|---|
| CN | 102635831 B | 3/2014 |
| CN | 204350442 U | 5/2015 |
| CN | 104394643 B | 12/2017 |

(Continued)

OTHER PUBLICATIONS

Wannemacher, Jr. "Stress controlling mounting structures for printed circuit boards", United States Statutory Invention Registration, Reg. Number: H921, Published: May 7, 1991, pp. 1-7.

*Primary Examiner* — Tremesha S Willis
(74) *Attorney, Agent, or Firm* — Edward J. Wixted, III

(57) ABSTRACT

A flexible circuit substrate that includes a conductive line on a flexible substrate and at least one slot in the conductive line on the flex substrate, where at one slot is in an area of the flexible circuit substrate that will be bent to prevent an open in the conductive line on the flexible substrate.

15 Claims, 6 Drawing Sheets

(56) References Cited

FOREIGN PATENT DOCUMENTS

| DE | 2835961 A1 | 2/1980 |
|---|---|---|
| WO | 2010045540 A2 | 4/2010 |
| WO | 2010045540 A3 | 4/2010 |

\* cited by examiner

FLEXIBLE CIRCUIT STRUCTURE FOR CIRCUIT LINE BENDING

BACKGROUND OF THE INVENTION

The present invention relates generally to the field of flex circuit substrates and more particularly to the design of flex circuit lines to withstand the bending of the flex circuit substrate.

Many computer system applications today require the protection of sensitive data. The sensitive data may include user-specific identification data, user personal data, institutional protected data, such as financial or transactional data. In some computer system applications or networked computer systems, an approach to protecting sensitive data may include the use of a hardware security module which is a physical computing device that safeguards and manages digital keys, performs encryption and decryption functions for digital signatures, strong authentication, and other cryptographic functions. A hardware security module can be integrated into a general-purpose computing environment to withstand both physical and logical attacks and has special hardware to perform cryptographic operations and protect keys. Typically, a hardware security module contains one or more secure cryptoprocessor chips or cryptographic cards.

The hardware security module can be accessed from a host computer system using a carefully designed set of application-specific interface (API) functions. The API functions may be generic, or they may be designed to meet the special requirements of particular industries, such as banking and finance. Typically, these hardware security modules come in the form of a plug-in card or an external device that attaches directly to a computer system or a network server.

SUMMARY

Embodiments of the present invention disclose a flexible circuit substrate that includes a conductive line on a flexible substrate and at least one slot in the conductive line on the flex substrate, where at least one slot is in an area of the flexible circuit substrate that will be bent to prevent a line open in the conductive line on the flexible substrate.

BRIEF DESCRIPTION OF THE DRAWINGS

The above and other aspects, features, and advantages of various embodiments of the present invention will be more apparent from the following description taken in conjunction with the accompanying drawings.

DETAILED DESCRIPTION

Figure 1:
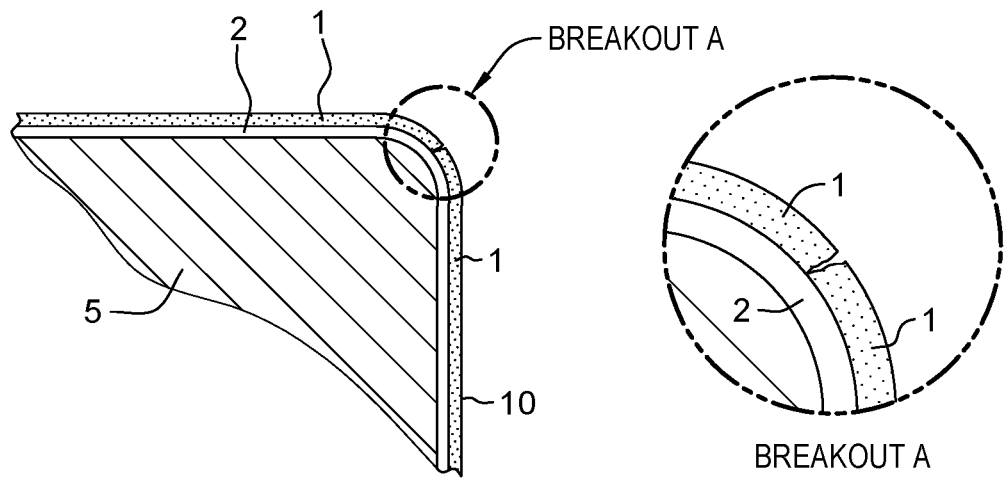
FIG. 1 depicts a cross-sectional view of a structure in a portion of an electronic device with a flexible circuit substrate over the structure in accordance with an embodiment of the present invention.

Embodiments of the present invention recognize cryptographic cards containing one or more cryptoprocessor chips or hardware security modules protecting cryptoprocessor chips may have features that provide tamper evidence or tamper alerting. The tamper evidence includes features identifying signs of tampering such as attempts to physically intrude into the computer system to access sensitive data. These features can include methods of identifying when an unauthorized user attempts to physically access protected, sensitive data and alerting protected data owners of the intrusion. These features providing alerting a computer system and/or the data user of physical tampering to access protected data tampering without making the hardware security system or cryptographic card inoperable and generating a notification to the user of the attempted protected data access. In some cases, embodiments of the present invention recognize that providing tamper responsiveness, such as deleting keys upon tamper detection may also be used to protect sensitive data. Embodiments of the present invention recognize a hardware security module or cryptographic card may contain one or more secure cryptoprocessor chips to prevent logical tampering and bus probing, or a combination of chips in a cryptographic card, chip module, or a hardware security module that is protected by the tamper-evident, tamper-resistant, or tamper responsive packaging. Embodiments of the present invention recognize that providing tamper-resistant and tamper-evident packaging that protects a cryptoprocessor chip or a hardware security module from physical intrusions or damage is becoming increasingly important to protect sensitive data.

Embodiments of the present invention recognize that one method of protecting a cryptoprocessor chip and/or a cryptographic card includes providing packaging that includes a mesh of circuit lines on multiple layers of flex circuits on one or more flexible circuit substrates. Embodiments of the present invention recognize that a cryptographic card, one or more cryptoprocessor chips, or a hardware security module can be encased in a physical structure, such as a box containing the cryptographic card with a cryptoprocessor chip or hardware security module. Embodiments of the present invention recognize that the cryptographic card or hardware security module in a physical structure may be surrounded and protected by a mesh of circuit lines, such as circuit lines on a flexible circuit substrate where a break in one or more of the circuit lines can indicate an attempt to physically damage the cryptoprocessor chips or access protected data in the cryptoprocessor chips. Embodiments of the present invention recognize that an attempt to probe or tamper with a cryptoprocessor chip when the cryptoprocessor chip is encased within a mesh of multiple layers of flexible circuits can break one or more circuit lines in the flexible circuit substrates. The circuit line break can be identified by an increase in the electrical resistance of the flexible circuit substrates. The change in the electrical resistance of the flexible circuit substrate identifies the tampering and generates an alert to the protected data owner or shuts down the computer system or portions of the computer systems associated with the protected data storage.

Embodiments of the present invention recognize that enclosing or encasing one or more cryptoprocessor chips in a cryptographic card or hardware security module in a mesh of circuit lines on one or more flexible circuit substrates requires bending of the flexible circuit substrates. Embodiments of the present invention recognize that in some applications, the flexible circuit substrate must be bent around sharp or corners of the structure encasing the cryptoprocessor chips in on a cryptographic card. Embodiments of the present invention recognize that the flexible circuit substrates forming a mesh of circuits, in some cases, portions of the flexible circuit substrate may be bent 180 degrees to be laminated on another portion of itself to create multiple circuit layers from a single folded and laminated to itself. Embodiments of the present include multi-layer flexible circuit substrates formed with more than flexible substrate with one or more metal or conductive layers with conductive lines that are joined together by an adhesive material and/or a lamination process.

Embodiments of the present invention recognize when the flexible circuit substrate has a large bend angle going around a structure or when bent over to be laminated to another portion of itself, a high-stress region occurs in the circuit lines on the portions of the flexible circuit substrate that are bent. Embodiments of the present invention recognize that the high-stress areas of the circuit lines that are subjected to a high degree of bending often break during bending. The breaking of flex circuit lines in the flexible circuit substrate during bending results in a yield loss that can be substantial depending at least in part on the application, the thickness of the flexible circuit substrate, and the number of bends required. Embodiments of the present invention recognize that a new flexible circuit substrate structure preventing or reducing flexible circuit line opens during bending in the assembly of the flex circuit lines an end-use application of the flexible circuit substrate would be desirable. More specifically, new flexible circuit substrate structures that reduce flexible circuit substrate yield loss due to open circuit lines in high-stress portions of the flex circuit lines during assembly and bending of the flexible circuit substrate to create tamper-resistant packaging of one or more cryptoprocessor chips protecting sensitive data is desirable.

Embodiments of the present invention provide a flexible circuit substrate with one or more circuit lines that include at least one slot in the circuit line that will be aligned with a high-stress area of the flexible circuit substrate when the flexible circuit substrate is bent. The slot in the circuit line prevents a crack that can initiate from a surface defect, a notch, or other circuit plating defect from extending across the circuit line to create an open circuit line. When a slot is present in the circuit line, a crack can initiate and propagate across a portion of the circuit line but, will not be able to propagate across the slot. Embodiments of the present invention provide a circuit line on a flexible circuit substrate where no circuit line material is present in the slot. Embodiments of the present invention provide a circuit line in the flexible circuit substrate where the crack propagation in the circuit line ends at the edge of the slot in the circuit line and at one outer edge of the circuit line. In this way, cracks initiating and propagating in the portion of the flexible circuit substrate with a slot in the circuit line do not create an open in the circuit line during bending of the flexible circuit substrate.

Embodiments of the present invention provide a flexible circuit substrate with one or more slots in each circuit line where the slots are designed to align with high-stress bending areas of the flexible circuit substrate during an assembly operation using the flexible circuit substrate. Embodiments of the present include multi-layer flexible circuit substrates formed with more than flexible substrate with one or more metal or conductive layers with conductive lines that are joined together by an adhesive material and/or a lamination process. Embodiments of the present invention provide a variety of flexible circuit substrate structures with slots in one or more circuit lines to reduce circuit line opens during bending of the flexible circuit substrate.

Embodiments of the present invention provide more than one slot aligned around a centerline of the circuit line. Embodiments of the present invention provide two or more slots aligned above or below each other in at least one portion of the flexible circuit substrate which will be bent. Embodiments of the present invention provide a number of slots that are aligned around the centerline of the circuit line in an end to end arrangement. Furthermore, embodiments of the present invention provide one or more slots in one or more circuit lines in a flexible circuit substrate that are filled with a crack resistant material. The slots filled with a crack resistant material, such as a nanofiber composite provide additional reinforcement to the circuit line and provided additional crack retardation preventing opens during bending of the flexible circuit substrate. Embodiments of the present invention provide several methods of forming the flexible circuit substrate with slots filled with the crack resistant material.

The following description references the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Some of the process steps, depicted, can be combined as an integrated process step. In addition, descriptions of well-known functions and constructions may be omitted for clarity and conciseness.

The terms and words used in the following description and claims are not limited to the bibliographical meanings, but, are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context dictates otherwise. Thus, for example, reference to "a component surface" includes reference to one or more of such surfaces unless the context dictates otherwise.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" or "contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined for presentation and illustration purposes and in some instances may have not been described in detail. In other instances, some processing steps or operations that are known in the art may not be described at all. It should be understood that the following description is rather focused on the distinctive features or elements of various embodiments of the present invention.

Detailed embodiments of the claimed structures and methods are disclosed herein. The method steps described below do not form a complete process flow for manufacturing flex circuits, such as flex cables or flexible circuit substrates which may have multiple circuit lines and multiple layers. As known to one skilled in the art, while not specifically depicted, flexible circuit substrates or flex cables can be folded back and forth upon itself, using adhesives. In some cases, or multiple flexible circuit substrates can be adhered together in various configurations. The present embodiments can be practiced in conjunction with the flexible circuit fabrication techniques for flexible circuit substrate currently used in the art, and only so much of the commonly practiced process steps are included as are necessary for an understanding of the described embodiments. The figures represent cross-section portions of a flexible circuit substrate, such as a portion of a flexible circuit substrate during fabrication, and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Reference will now be made in detail to the embodiments of the present invention, examples of which are illustrated in the accompanying drawings, wherein like reference numerals refer to like elements throughout.

FIG. 1 depicts a cross-sectional view of structure 5 in a portion of an electronic device with flexible circuit substrate 10 over structure 5 in accordance with an embodiment of the present invention. As depicted, FIG. 1 includes flexible circuit substrate 10 formed with line 1 and flex substrate 2 that is over structure 5 which is a portion of an electronic device or a device enclosure that may include one or more cryptoprocessor. FIG. 1 also includes Breakout A depicting an exploded view of the high-stress portion of flexible circuit substrate 10 with a crack in line 1 above the corner of structure 5. For example, structure 5 can be a wall or a side of 360-degree enclosure for a cryptographic card in a secure computer system or in another example, structure 5 can be a portion of a case for a device in a size restricted use or a device in a secure data protection use in a military or space application. Flexible circuit substrate 10 can be used in other applications requiring a high degree of flexibility and bending, such as magnetic read-write head or disk assemblies.

As depicted, flexible circuit substrate 10 includes line 1 on flex substrate 2. Not depicted in FIG. 1, but present in various embodiments, is a layer of an adhesive material joining flex substrate 2 to line 1 that was formed from a copper foil or copper layer using typical flex cable manufacturing processes. Breakout A of flexible circuit substrate 10 includes a portion of flexible circuit substrate 10 above the corner of structure 5. In various embodiments, flexible circuit substrate 10 provides one or more of lines 1 on flex substrate 2.

In various embodiments, flexible circuit substrate 10 has more than one or more metal layer. For example, more one layer of flex substrates 2 and more than one metal layer with line 1 (not depicted). In some embodiments (not depicted in FIG. 1), flexible circuit substrate 10 includes a single metal layer and flexible circuit substrate 10 is folded over itself multiple times. For example, some portions of flexible circuit substrate 10 are folded over two other portions of flexible circuit substrate 10 and may be held in place by an adhesive and/or applied pressure. In this way, flexible circuit substrate 10 essentially creates three layers of metal or lines 1 that are above or below another level of line 1 (e.g., flexible circuit substrate 10 is similar to or provides wiring like a three-metal layer flex). In other examples, as known to one skilled in the art, multiple layers of flexible substrate 2 with a metal layer with line 1 can be laminated or joined with a layer of adhesive material to form a multilayer flexible circuit substrate 10 with multiple flexible substrates 2 and multiple metal layers with lines. 1 (not depicted in FIG. 1). In one embodiment, a portion of line 1 includes an opening or slot in a center portion of line 1 (not depicted in FIG. 1). Flexible circuit substrate 10 can be formed with conventional flex manufacturing processes.

Flexible circuit substrate 10 can be a portion of the security protection hardware packaging used to protect sensitive data in a computer system or mobile device. For example, changes in the resistance of line 1 on flexible circuit substrate 10 can identify invasive actions or attempts by outside entities, who have not been provided access to protected data, to access the protected data in a semiconductor chip or a data storage device surrounded or partially surrounded by flexible circuit substrate 10. As previously discussed, flexible circuit substrate 10 may cover structure 5 which is a portion of an enclosure or box encasing a cryptoprocessor chip in a hardware security module or a cryptographic card. In some cases, flexible circuit substrate 10 may be bent or in some cases, folded to fit into a tight enclosure to cover one or more electronic components in a small enclosure (e.g., may need to provide 360-degree coverage of the electronic components to prevent unauthorized data access).

In various embodiments, flexible circuit substrate 10 with line 1 experiences a high degree of bending. As depicted in FIG. 1, line 1 may have a bend angle of 90 degrees or more. In some applications, flexible circuit substrate 10 may be folded over itself and require a bend angle of approximately 180 degrees. For functionality of flexible circuit substrate 10, line 1 cannot completely break during or after bending. When line 1 breaks during bending, a portion of the electrical circuit is broken. For example, when line 1 breaks in an end-use security application where flexible circuit substrate 10 provides tamper protection for a cryptographic card, the change in the resistance of line 1 of flexible circuit substrate 10 can indicate that an outside source is attempting to access the protected data. If line 1 breaks during the initial bending of flexible circuit substrate 10 over structure 5, then flexible circuit substrate 10 is not completely functional as a tamper indicator. When one or more of lines 1 break during bending of flexible circuit substrate 10 (e.g., bending around structure 5), flexible circuit substrate 10 becomes scrap. The breaking of one or more of lines 1 on flexible circuit substrate 10 during bending of flexible circuit substrate 10 for an end-use application generates yield loss of flexible circuit substrate 10.

Line 1 can be one of many lines in flexible circuit substrate 10. Line 1 can be composed of any conductive or metal material used to create circuit lines on a flex cable or a flex circuit substrate such as flexible circuit substrate 10. For example, line 1 can be composed of copper or a copper with a nickel, gold, or another metal plating over or under line 1 (e.g., a flash seed plating or a protective metal layer), a conductive ink, etc. In various embodiments, line 1 can be a foil or a layer of copper that is joined to flex substrate 2 with an adhesive (not depicted) or line 1 can be deposited or plated on flex substrate 2 using known electroplating or electroless plating processes. One or more of lines 1 can be patterned and etched using known photolithographic and subtractive etch processes for flex substrate manufacture. In some embodiments a protective coat or layer (not depicted), such as an epoxy or a polyimide maybe over line 1.

In various embodiments, line 1 is in a very thin layer of the conductive metal. The thickness and the width of line 1 can be important in security applications protecting the hardware security module or other cryptographic security. In these security applications, a very thin line 1 in the 7 to 20 micron range. A thin line 1 can be delicate and line breakage due to tampering or attempts to physically access the cryptographic card and/or protected, sensitive data can be detected (e.g., by changes in electrical resistance of flexible circuit substrate 10).

Flex substrate 2 can be any flexible dielectric material used in flexible circuit manufacture. For example, flex substrate 2 can be a polyimide but is not limited to polyimide materials. Flex substrate 2 depicted in FIG. 1 may be only a portion of a large, a small, or a long, flexible circuit substrate 10. While FIG. 1 depicts a single layer of flex substrate 2 with line 1, in other examples, multiple layers of flex substrate 2 with line 1 may be joined together using adhesive layers (e.g., a multilayer flexible circuit substrate 10).

Breakout A depicts an enlargement of the portion of flex substrate 2 and line 1 above a corner of structure 5. While Breakout A depicts a detailed view of a crack that propagates in a high-stress area of flexible circuit substrate 10 that is above a corner of structure 5, in other embodiments, the high-stress area of flexible circuit substrate 10 occurs inside a corner of an enclosure or a box. As depicted in Breakout A, a crack initiates and propagates in line 1 above the corner of structure 5. When line 1 is thin, crack initiation and propagation in high-stress areas or bends of flexible circuit substrate 10 occurs more frequently. Edge defects, surface defects, necking, grain defects, and other similar defects in flex lines can create areas for crack initiation, especially under applied bending forces to conform to or enclosure various structures. In some cases, when line 1 does not include a slot (i.e., like slot 23A in FIG. 2), the crack depicted in Breakout A extends across the width of line 1 causing an open (e.g., line 1 does not conduct an electrical signal across the crack formed at the bend of line 1 depicted in Breakout A).

Figure 2:
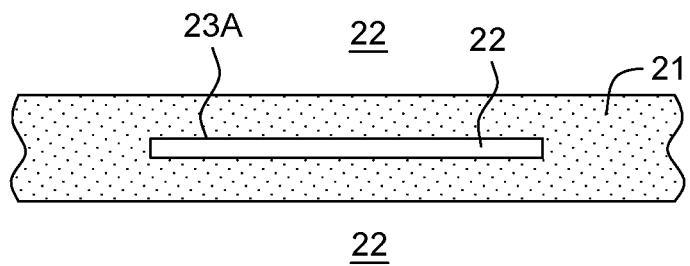
FIG. 2 depicts a top view of a portion of the flexible circuit substrate with a slot in a circuit line of the flexible circuit substrate in accordance with an embodiment of the present invention.

FIG. 2 depicts a top view of a portion of flexible circuit substrate 20 with slot 23A in line 21 in accordance with an embodiment of the present invention. As depicted, FIG. 2 includes flexible circuit substrate 20, line 21 on flex substrate 22. A portion of flex substrate 22 is visible in slot 23A. Flex substrate 22 is essentially the same as flex substrate 2.

As depicted, line 21 includes slot 23A in the center portion of line 21. In various embodiments, line 21 is a thin metal line. Line 21 may have a width that ranges from 50 microns to 500 microns but the width of line 21 is not limited to these ranges. A typical thickness of line 21 can range from 7 to 50 microns but is not limited to this range of thickness. In some embodiments, line 21 is composed of a very thin conductive material layer. For example, in security related applications, line 21 can be 7-20 microns thick.

In various embodiments, the length and/or width of slot 23A vary depending on the application flexible circuit substrate 20 is used in. For example, a typical width of slot 23A may range from 5 to 25 percent of the width of line 21. In some applications, the typical length of slot 23A may range of 0.2 to 2 cm but slot 23A is not limited to these ranges.

Slot 23A in FIG. 2 is designed to prevent a crack from propagating across the width of line 21. As depicted later in FIG. 3B, a crack may initiate and propagate across one side of flexible circuit substrate 20 but will not propagate to the other side of slot 23A. In various embodiments, slot 23A in flexible circuit substrate 20 is designed and etched in line 21 to be positioned or aligned over the high-stress bending areas where flexible circuit substrate 20. In other words, slot 23A is designed in a portion of flexible circuit substrate 20 that will be bent (e.g., a portion of flexible circuit substrate 20 bent around structure 5 in FIG. 1). A length of slot 23A can vary and will be dependent on a bend angle and a size of the structure that flexible circuit substrate 20 is designed to be bent around or into.

In some embodiments, more than one slots 23A are designed and etched in line 21 for alignment of each of the high-stress areas of flexible circuit substrate 20 when flexible circuit substrate 20 formed around or in a structure requiring multiple bending areas or corners. In other embodiments, a large number of slots 23A are present in flexible circuit substrate 20 at fixed intervals as depicted later with respect to FIGS. 5 and 6.

Figure 3A:
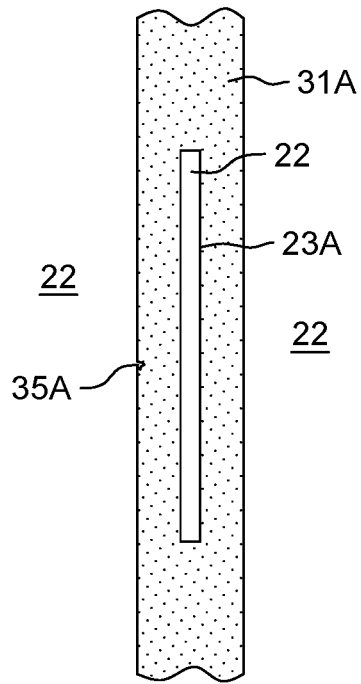
FIG. 3A depicts a top view of a portion of the flexible circuit substrate with a slot in the circuit line in a bending area of the flexible circuit substrate before bending the flexible circuit substrate in accordance with an embodiment of the present invention.

FIG. 3A depicts a top view of a portion of flexible circuit substrate 30A with slot 23A in line 31A before bending flexible circuit substrate 30A in accordance with an embodiment of the present invention. As depicted, FIG. 3A includes flexible circuit substrate 30A, flex substrate 22, slot 23A, line 31A, and defect 35A in a portion of line 31A adjacent to slot 23A. Flexible circuit substrate 30A, flex substrate 22, slot 23A, and line 31A are essentially the same as flexible circuit substrate 20, flex substrate 22, slot 23A, and line 21 in FIG. 2 except for the addition of defect 35A. Defect 35A may be a surface defect, a neck or notch, or a plating defect in line 31A which can acts as a crack initiation point during bending of flexible circuit substrate 30A. In FIG. 3A, flexible circuit substrate 30A is depicted prior to bending flexible circuit substrate 30A.

Figure 3B:
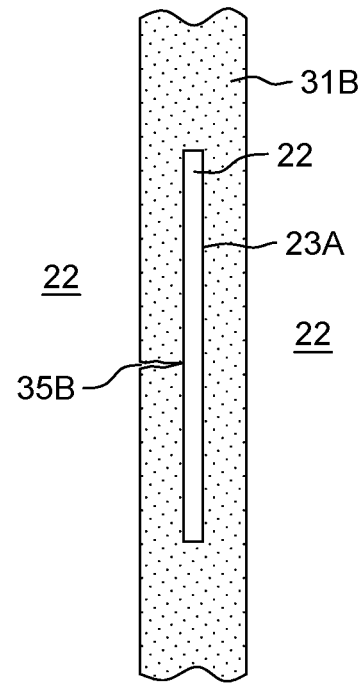
FIG. 3B depicts a top view of a portion of the flexible circuit substrate with a slot in the circuit line in a bending area of the flexible circuit substrate after bending the flexible circuit in accordance with an embodiment of the present invention.

FIG. 3B depicts a top view of a portion of flexible circuit substrate 30B with slot 23A in line 31B after bending in accordance with an embodiment of the present invention. As depicted, FIG. 3B includes flexible circuit substrate 30B with the elements of FIG. 3A and crack 35B in a portion of line 31B adjacent to slot 23A. Crack initiation and propagation in a conventional flex circuit line, particularly in a bend area of the flex circuit, typically can propagate across the width of the flex circuit line causing an open in the flex circuit line. A flex circuit substrate with one or more open lines is generally considered unusable (i.e., a yield loss). As depicted in FIG. 3B, slot 23A in line 31B prevents an open in line 31B during bending of flexible circuit substrate 30B.

In many examples, during bending of flexible circuit substrate 30B, crack 35B is initiated from defect 35A and propagates across the left side of line 31B that is adjacent to slot 23A. Crack 35B cannot propagate across slot 23A. The right side of line 31B remains intact and electrical current can flow through line 31B on the right side of slot 23A. Slot 23A can prevent or reduce flexible circuit substrate 30B yield loss during mechanical bending. Especially with thin metal conductor lines, for example in the range of 7 to 20 microns thick, a significant yield loss can occur during mechanical bending of a flex circuit substrate without slots 23A. In various embodiments, using one or more of slot 23A formed in bending areas of flexible circuit substrate 30A and 30B can provide significantly improved flexible circuit substrate 30B yields during mechanical bending as compared to a flexible circuit substrate without slot 23A. The addition of slot 23A in the bending area of flexible circuit substrate 30B prevents an open in line 31B during bending of flexible circuit substrate 30B for an end-use application.

As depicted in FIG. 3B, after bending flexible circuit substrate 30B, the right portion of line 41B adjacent to slot 23A can carry electrical current through flexible circuit substrate 30B. The narrower right-side portion of line 31B is still available to carry electrical current. Using the right side of line 31B will provide a higher resistance than line 31B in FIG. 3A or line 21 in FIG. 1 however, the resistance loss is not significant to prevent the functionality of flexible circuit substrate 30B.

Figure 4:
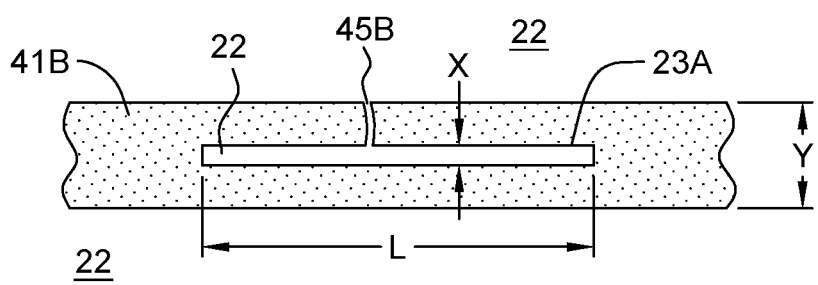
FIG. 4 depicts dimensions on a top view of a portion of the flexible circuit substrate with a slot in the circuit line in a bending area of the flexible circuit substrate after bending the flexible circuit substrate in accordance with an embodiment of the present invention.

FIG. 4 depicts one example of the dimensions of flexible circuit substrate 40 in a top view of a portion of flexible circuit substrate 40 with a slot 23A in line 41B after bending flexible circuit substrate 40 in accordance with an embodiment of the present invention. As depicted, FIG. 4 includes elements of FIG. 3B except that line 31B is line 41B and crack 35B is crack 45B and the addition of the labels for line width Y, slot 23A length L, and slot 23A width X. Using the copper resistivity $\rho$ of $1.68 \times 10^{-8}$ ohm m and an example of dimensions for line 41B width Y, slot 23A length L, and slot 23A width X, a change in resistance of line 41B can be estimated with one slot 23A, multiple slots 23A, and for the right side of line 41B when crack 45B is present.

For example, if slot 23A length L was 5 to 10 mm and slot 23A width X was 7 to 20 microns wide when line 41B width Y was 50 to 250 microns, the addition of slot 23A in flex circuit substrate 40 would be small when compared to a flex circuit substrate without slot 23A. If one side of line 41 in flexible circuit substrate 40 cracks adjacent to slot 23A (as depicted with crack 35B in FIG. 3B), then an increase in the resistance of line 41 would be very small or below 0.02% change.

In this example, line 41 in flexible circuit substrate 40 is still functional (can carry electrical current) even when one half of line 41 is open. In this way, adding slot 23A to flexible circuit substrate 40 greatly reduces flexible circuit substrate 40 fails due to open lines. Slot 23A can reduce flexible circuit substrate 40 yield loss due to bending of flexible circuit substrate 40 into an end-use application or structure (e.g., around structure 5 in FIG. 1).

Figure 5:
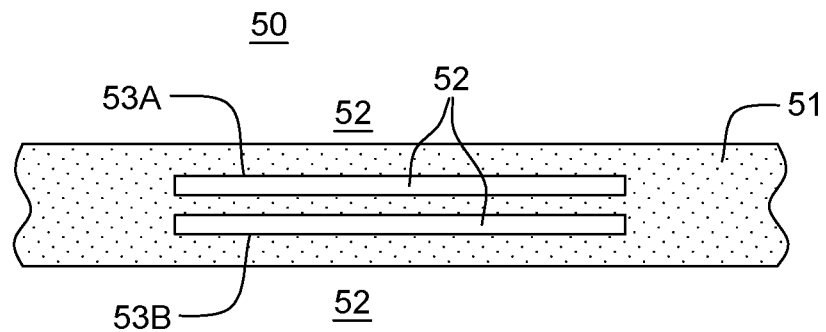
FIG. 5 depicts a top view of a portion of the flexible circuit substrate with two slots in a circuit line in accordance with an embodiment of the present invention.

FIG. 5 depicts a top view of a portion of flexible circuit substrate 50 with slots 53A and 53B in line 51 in accordance with an embodiment of the present invention. Line 51 is essentially the same or similar to line 21 in FIG. 2 with the addition of another slot in line 51. Flex substrate 52 is essentially the same as flex substrate 22 in FIG. 2. As depicted, two slots (i.e., slot 53A and 53B) similar to slot 23A in FIG. 2 are centered in line 51 and are aligned with each other (e.g., the ends of slot 53A and the ends of slot 53B are directly above or below each other). For example, slots 53A and 53B are vertically aligned around the centerline of line 51 and are an equal distance from the centerline. In some embodiments, when an odd number of slots, such as three slots like slots 53A and 53B are present one slot is positioned on the center line of line 51 and the remaining slots spaced an equal distance apart from the adjacent slots.

Slots 53A and 53B provide a similar function as slot 23A in FIG. 3B. Slots 53A and 53B prevent cracks that initiate in line 51 in a high-stress portion of flexible circuit substrate 50 during bending from propagating across the full width of line 51. As depicted, slot 53A is above slot 53B and slots 53A and 53B are vertically aligned around line 51. Within a cross-section of a portion of line 51 two slots can be present. In some examples, more than two slots, such as slots 53A and 53B in line 51 are present.

As previously discussed in detail with respect to FIG. 4, in flexible circuit substrate 50, a crack can initiate and propagate on either side of slot 53A or slot 53B and the crack will stop at the other edge of either slot 53A, slot 53B, and an outer edge of line 51 leaving at least a portion of line 51 intact after bending or forming flexible circuit substrate 50.

Flexible circuit substrate 50 provides an additional slot to ensure that at least one portion of line 51 remains to transmit electrical current through flexible circuit substrate 50 after bending. Slots 53A and 53B may improve or further improve flexible circuit substrate 50 yields after bending when compared to bending a flex circuit substrate without slots 53A and 53B. While FIG. 5 depicts two slots (e.g., slot 53A and 53B), in other examples, more than two slots may be present in flexible circuit substrate 50.

Figure 6:
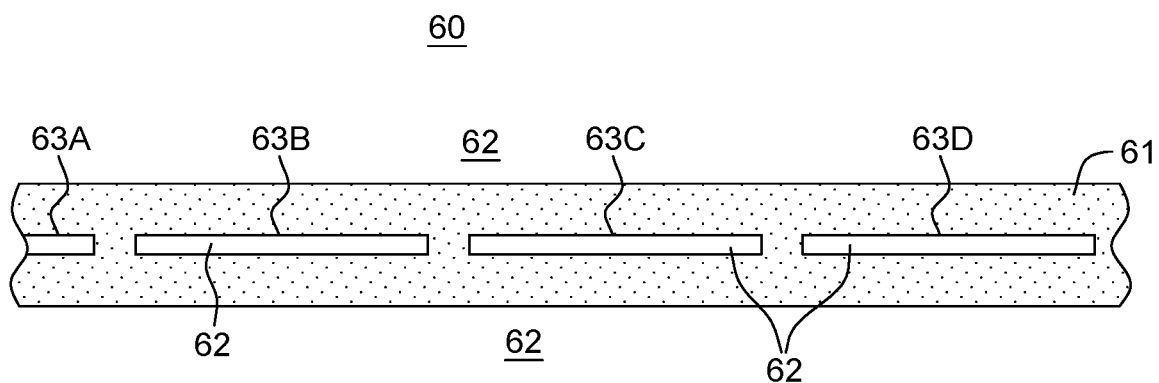
FIG. 6 depicts a top view of a portion of the flexible circuit substrate with multiple slots in a circuit line in accordance with an embodiment of the present invention.

FIG. 6 depicts a top view of a portion of flexible circuit substrate 60 in accordance with an embodiment of the present invention. As depicted, FIG. 6 includes flex substrate 60 includes line 61 on flex substrate 62 and slots 63A-63D aligned in parallel along the length of flexible circuit substrate 60. Flex substrate 62 is essentially the same as flexible circuit substrate 20 and flex substrate 22 in FIGS. 1 and 2. Line 61 is similar to line 21 in FIG. 2 with additional slots 63A-63D in line 61 that are aligned in parallel end to end along a center portion or center of line 61. Each of slots 63A-63D are similar or essentially the same as slot 23A.

In various embodiments, multiple slots 63A-63D slots extend along the complete length of flexible circuit substrate 60. In other words, flexible circuit substrate 60 can have slots 63A-63N (e.g., a large number of slots) in line 61. The space between the ends of each adjacent slot of slots 63A-63D can be designed such that at least a portion of one of slots 63A-63D will aligned or be positioned over bending areas of flexible circuit substrate 60 in the end-use application. For example, with multiple slots 63A-63D repeated along a length of flexible circuit substrate 60, at least one slot of the multiple slots 63A-63D will be in a high-stress area of flexible circuit substrate 60 when flexible circuit substrate 60 is bent for the end-use application. In this case, flexible circuit substrate 60 does not need to be designed for specific slots 63A-63D to be aligned with the high-stress bending area of flexible circuit substrate 60 during flex assembly in a final or end-use application. When slots 63A-D are repeated along the length of flexible circuit substrate 60, the alignment of slots 63A-D is not required as the slots are present everywhere in flexible circuit substrate 60.

In some embodiments, the distance between adjacent ends of the slots (e.g., 63A and 63B and slots 63B and 63C, etc.) is small. For example, a distance between the ends of adjacent slots (e.g., between slot 63A and 63B) be 15 microns to 5 mm but can be larger in some applications. In other examples, the distance between the ends of two adjacent slots, such as slot 63A and 63B can range from 2 to 10 times the width of the slots but is not limited to this range.

Figure 7:
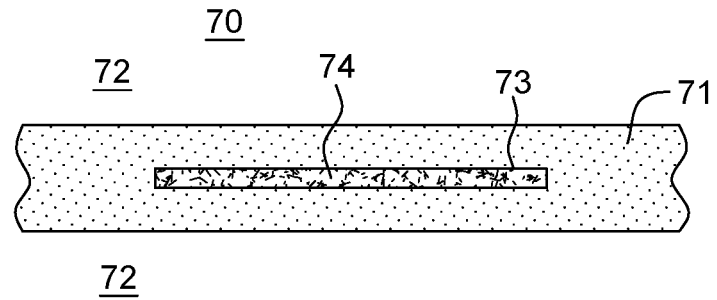
FIG. 7 depicts a top view of a portion of the flexible circuit substrate with a slot filled with a crack resistant material in a circuit line in accordance with an embodiment of the present invention.

FIG. 7 depicts a top view of a portion of flexible circuit substrate 70 with slot 73 filled with a crack resistant material 74 in accordance with an embodiment of the present invention. As depicted, FIG. 7 includes flex substrate 72, line 71, slot 73, and crack resistant material 74 in a portion of flexible circuit substrate 70. Flex substrate 72 and line 71 are essentially the same as flex substrate 22 and line 21 in FIG. 2. Slot 73 is essentially the same as slot 23A in FIG. 2 with the addition of crack resistant material 74 inside slot 73. Crack resistant material 74 can provide additional protection against crack propagation in line 71 during high-stress applications to flexible circuit substrate 70, such as bending flexible circuit substrate 70 over itself.

As depicted, flexible circuit substrate 70 includes at least one slot 73 that is filled with crack resistant material 74 providing reinforcement and further crack resistance to line 71 than a flex circuit without a slot or without a slot filled with crack resistant material 74. Crack resistant material 74 may be a nanofiber composite filler material. Various nanofiber composite materials provide excellent mechanical properties including crack resistance.

Crack resistant material 74 can be a nanofiber polymer composite material including one or more of carbon nanotube fibers, graphene fibers, cellulose fibers, diamond nanothreads, nano glass fibers, or any other suitable nanofiber material. The nanofiber reinforced polymer composite material can be formed with a polymer matrix with nanofiber fillers dispersed within the polymer matrix although other matrix materials may be used.

In some embodiments, crack resistant material 74 can be a nano material and polymer composite material including one or more of nanoparticles, such as silicon dioxide, carbon, or diamond particles, or nanosheets, such as graphene nanosheets in a polymer or another matrix material.

Crack resistant material 74 can be deposited or formed in slot 73 with or more methods, such as electrospinning, spin-on-glass, or nanocomposite growth. Crack resistant material 74 can be deposited or grown to fill slot 73. In various embodiments, a thickness of crack resistant material 74 is approximately the same as the thickness of flex substrate 72. In some embodiments, crack resistant material 74 conducts electricity. In these embodiments, crack resistant material 74 reduces the electrical resistance of line 71 as compared to line 21 in flexible circuit substrate 20 depicted in FIG. 2.

Figure 8:
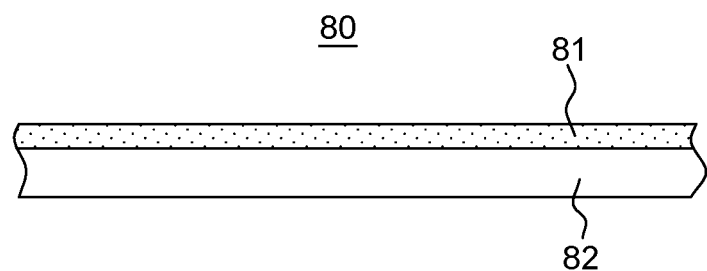
FIG. 8 depicts a cross-sectional view of a portion a flexible circuit substrate with a line in accordance with an embodiment.

FIG. 8 depicts a cross-sectional view of flexible circuit substrate 80 with flexible substrate 82 with line 81 in accordance with an embodiment. FIG. 8 depicts a step in a method of forming flexible circuit substrate 110 in FIG. 11. FIGS. 8-11 depict the steps of forming a slot filled with the crack resistant material in one embodiment of the present invention. FIG. 8 depicts a flex circuit substrate (e.g., flexible circuit substrate 80) before forming one or more slots filled with crack resistant material in line 81.

As depicted, FIG. 8 includes flex substrate 80 with line 81. Flex substrate 80 is essentially the same as flex substrate 20 and flex substrate 72 in FIGS. 2 and 7 respectively. Line 81 is a line that is one of many lines on flex substrate 80. In some embodiments, line 81 is a thin line. For example, as previously discussed, line 81 has a thickness of 7 to 20 microns but, is not limited to these thicknesses.

Figure 9:
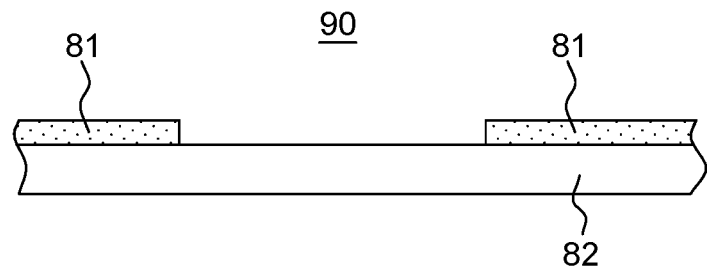
FIG. 9 depicts a cross-sectional view of the portion the flexible circuit substrate with the line after selectively removing a portion of the line in accordance with an embodiment of the present invention.

FIG. 9 depicts a cross-sectional view of flexible circuit substrate 90 with line 81 after selectively removing a portion of line 81 in accordance with an embodiment of the present invention. As depicted, FIG. 9 includes flex substrate 82 with two portions of line 81 where the center portion of line 81 has been removed using known photolithographic patterning and etch processes.

The portion of line 81 removed is essentially the same as slot 23A depicted in FIG. 2. As previously discussed with respect to slot 23A in FIG. 2, the amount of line 81 removed around the centerline of line 81 can vary depending on the application. In some embodiments, two slots are removed with one slot over the other slot around the centerline of line 81 (e.g., like slots 53A and 53B).

Figure 10:
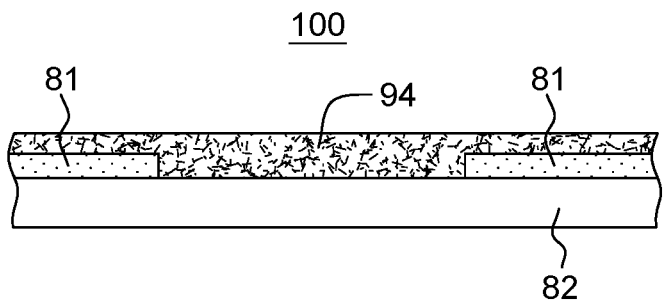
FIG. 10 depicts a cross-sectional view of the portion the flexible circuit substrate with the line after depositing a layer of a crack resistant material over exposed portions of the flexible substrate and the line in accordance with an embodiment of the present invention.

FIG. 10 depicts a cross-sectional view of the portion of flexible circuit substrate 100 with line 81 after depositing a layer of crack resistant material 94 over exposed portions of the flexible substrate and line 81 in accordance with an embodiment of the present invention. As depicted, FIG. 10 includes flexible circuit substrate 100 composed of flex substrate 82 and line 81 with a layer of crack resistant material 94 deposited over line 81 and exposed portions of flex substrate 82. Crack resistant material 94 is composed of essentially the same materials as crack resistant material 74 depicted in FIG. 7. In various embodiments, crack resistant material 94 is deposited using a spin-on process, such as electrospinning.

Figure 11:
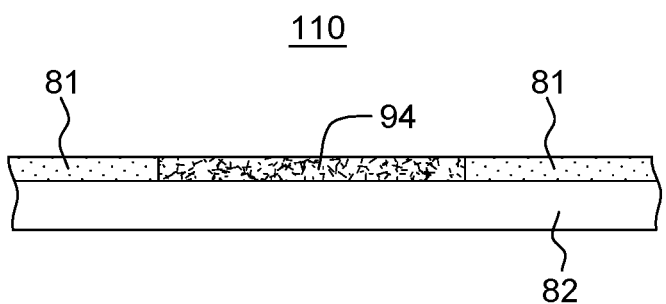
FIG. 11 depicts a cross-sectional view of the flexible substrate with the line after removing excess portions of the crack resistant material over the line and above the slot formed the line in accordance with an embodiment of the present invention.

FIG. 11 depicts a cross-sectional view of the portion of flexible circuit substrate 110 with line 81 after removing excess portions of crack resistant material 94 over a top surface of line 81 and above the slot formed by the removed portion of line 81 in accordance with an embodiment of the present invention. As depicted, FIG. 11 includes the elements of FIG. 10 with the top portions of crack resistance material 94 removed above line 81 and above the portions of flex substrate 82 not covered by line 81.

In various embodiments, one of a chemical mechanical polish (CMP) process or an etch process is used to remove excess crack resistant material 94 above line 81 and flex substrate 82. For example, a CMP stopping at the top surface of line 81 may be performed or a dry etch process, such as a reactive ion etch (RIE) process can be used stopping at the top surface of line 81. After removing the excess crack resistant material 94, the top surface of crack resistant material 94 and flex substrate 82 are level.

Figure 12:
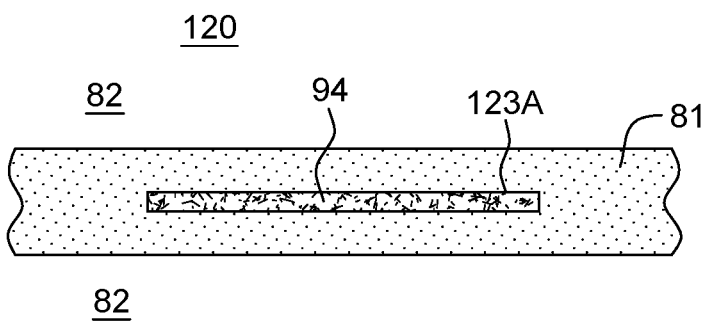
FIG. 12 depicts a top view of a portion of the flexible circuit substrate with a slot filled with a crack resistant material after removing the crack resistant material from the flexible substrate surface outside of the circuit line in accordance with an embodiment of the present invention.

FIG. 12 depicts a top view of flexible circuit substrate 120 after removing crack resistant material 94 from the portions of flex substrate 82 outside of line 81 in accordance with an embodiment of the present invention. As depicted, FIG. 12 includes line 81 with slot 123A filled with crack resistant material 94 on flex substrate 82 in flexible circuit substrate 120 after an optional step of removing crack resistant material 94 above the top surface of flex substrate 82 outside of the outer edges of line 81 and/or between adjacent lines 81 on flex substrate 82. After removing crack resistant material 94 above surfaces of flex substrate 82 not inside of slot 123A, only portions of crack resistant material 94 inside of slot 123A remain.

As discussed above with reference to FIG. 11, portions of crack resistant material 94 not inside slot 123A may be removed using known photolithographic patterning of flexible circuit substrate 132 and an etch process, such as RIE, for example. As depicted, flexible circuit substrate 120 and slot 123A are essentially the same as flexible circuit substrate 700 and slot 73 depicted in FIG. 7.

In other embodiments, multiple slots 123A are formed around a centerline of line 81. In these embodiments, two or more slots 123A can be positioned around the centerline (e.g., or around and on the centerline with three slots 123A) similar to slots 53A and 53B depicted in FIG. 5 but with the three slots 123A filled with crack resistant material 94. In some embodiments, multiple slots 123A are formed end to end along the center line of line 51. In these embodiments, the positioning and spacing of the multiple slots 123A is similar to or the same as slots 63A-63D depicted in FIG. 6.

In some embodiments, the step of removing crack resistant material 94 outside of line 81 or between multiple lines 81 as depicted in FIG. 12 does not occur. In these embodiments, crack resistant material 94 is a dielectric or non-conductive crack resistant material that coats the surface flexible substrate 82 not covered by line 81. When the step of removing crack resistant material 94 outside of line does not occur, then in FIG. 12, the areas of flexible circuit substrate 120 outside of line 81 labelled as flex substrate 82 will be also be crack resistant material 94.

In an alternative method of forming flexible circuit substrate 120 with slot 123A, a sacrificial carrier with a seed layer is provided. The sacrificial carrier, which can be composed of a layer of a flex substrate material, such as polyimide, a polyester, or another flexible sacrificial carrier material is coated on a surface with a seed layer (e.g., a thin layer of copper). The seed layer is covered with a photolithographic mask material. The mask material on the sacrificial material is patterned and selectively etched to form the slots in the desired areas (e.g., the high-stress bending areas of the flexible circuit substrate). The patterned mask exposes one or more portions of the seed layer on the sacrificial carrier.

After patterning, the nanocomposite material can be grown on the exposed seed layer. For example, one of nanoparticles, nanofibers, nanosheets, or nanotubes, such as graphite nanotubes to form a nanocomposite can be grown on the exposed portions of the seed layer. The nanofibers or nanotubes can be used as a crack resistant material such as crack resistant material 94. The photolithographic mask material can be removed leaving the portions of the nanoparticles or tubes on the sacrificial carrier in the desired areas corresponding to slots 123A in flexible circuit substrate 120.

A flexible circuit substrate similar to flexible circuit substrate 120 with the slots etched in line 81 flexible substrate 82 with slots etched in line 81 is provided. The slots may be etched with the known patterning and etch processes previously discussed with respect to FIG. 9. The sacrificial carrier with one or more portions of nanoparticles or nanotubes is positioned above the flexible circuit substrate with lines 81 such that each portion of the nanoparticles or nanotubes is precisely aligned to a slot in line 81. The sacrificial carrier with the nanoparticles or nanotubes forming a nanocomposite material can be stamped or laminated to the top surface of lines 81 and exposed portions of flex substrate 82. The sacrificial carrier can be released or removed from the surfaces of line 81 and the portions of nanoparticles or nano tubes fill slot 123A formed in line 81. After adhering the nanoparticles or nanotubes as crack resistant material 94 to the exposed portions of line 81 and removing the sacrificial carrier, flexible circuit substrate 120 can be formed with crack resistant material 94 filling slots 123A.

Figure 13:
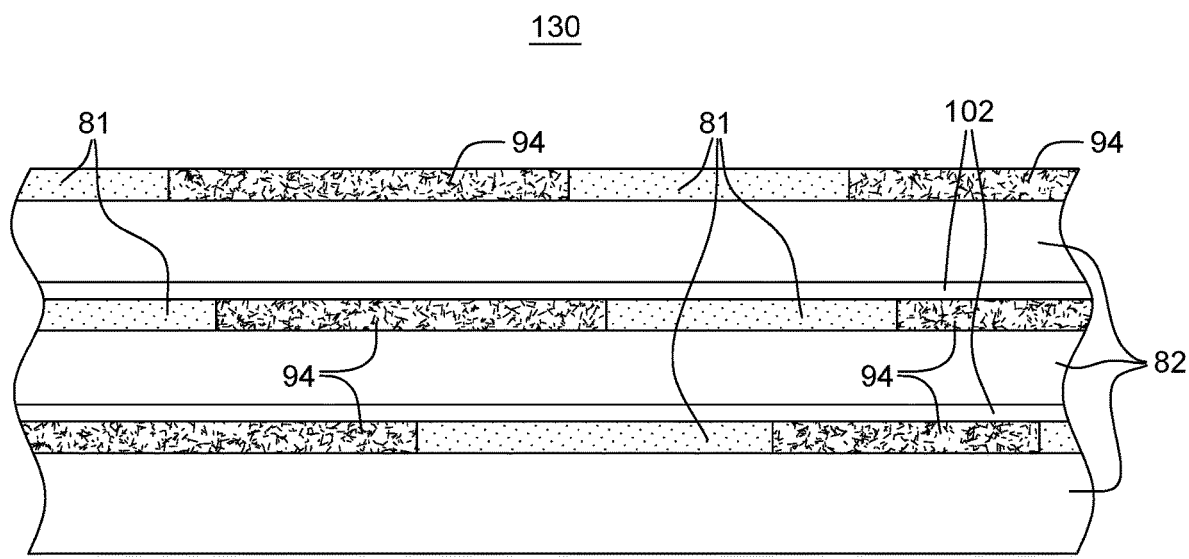
FIG. 13 depicts a cross-sectional view of three flexible substrates with lines and the crack resistance material in the slots formed in the lines that are joined together by an adhesive material in accordance with an embodiment of the present invention.

FIG. 13 depicts a cross-sectional view of flexible circuit substrate 130 composed of 3 layers of flexible substrate 82 with lines 81 with crack resistance material 94 in the slots in line 81 that are joined together by adhesive material 102 in accordance with an embodiment of the present invention. In various embodiments, flexible circuit substrate 130 is multilayer circuit (e.g., 2 or more layers) formed by laminating multiple single layers with flex substrate 82, line 81 and crack resistant material 94. For example, adhesive material 102 may be applied to a top surface of flexible circuit substrate 82, line 81 and crack resistant material 94, and laminating another or portion layer of the bottom of flex substrate 82, line 81 and crack resistant material 94. In an embodiment, flexible circuit substrate 130 does not include crack resistant material 94 (e.g., flexible circuit substrate 130 consists of three of flexible circuit substrates 20 depicted in FIG. 2 laminated together).

While FIG. 13 depicts flexible circuit 130 with 3 layers of flex substrate 82, lines 81 and crack resistant material 94 laminated together by adhesive 102, in other embodiments, flexible circuit substrate 130 can be folded once or any number of times (e.g., two or more times) and laminated to itself to form multiple layers (e.g., one of flexible circuit substrate 110 in FIG. 11 folded over itself to form three layers).

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A flexible circuit substrate comprising:
    a flexible substrate;
    a conductive line in a metal layer on the flexible substrate; and
    a plurality of slots in a center portion of the conductive line on the flexible substrate, wherein a distance between adjacent ends of adjacent slots of the plurality of slots is two to ten times a width of a first slot of the plurality of slots.

2. The flexible circuit substrate of claim 1, wherein the plurality of slots in the conductive line are aligned along a centerline of the conductive line.

3. The flexible circuit substrate of claim 1, wherein one or more of the plurality of slots are in the center portion of the conductive line and align with a high-stress bending area of the conductive line in an end-use application.

4. The flexible circuit substrate of claim 1, wherein each slot of the plurality of slots in the conductive line has a width that is 5 to 25 percent of a width of the conductive line.

5. The flexible circuit substrate of claim 1, wherein each slot of the plurality of slots in the conductive line has a length that is larger than a width of the slot.

6. The flexible circuit substrate of claim 1, wherein a crack in the conductive line propagates across one side of the conductive line adjacent to at least one slot after bending the flexible circuit substrate.

7. The flexible circuit substrate of claim 1, wherein the plurality of slots in the conductive line on the flexible substrate, further comprises:
    more than one slot of the plurality of slots in the conductive line are positioned around a centerline of the conductive line; and
    each slot of the plurality of slots is an equal distance from the centerline of the conductive line, wherein two or more of the more than one slots are above or below each other.

8. The flexible circuit substrate of claim 1, wherein the flexible circuit substrate is folded and laminated with an adhesive material.

9. A flexible circuit substrate comprising:
    a flexible substrate;
    a conductive line in a metal layer on the flexible substrate; and
    at least one slot in the conductive line in the metal layer on the flexible substrate filled with a crack resistant material, wherein the crack resistant material is an electrically conductive material.

10. The flexible circuit substrate of claim 9, wherein the crack resistant material is in the at least one slot in the conductive line, wherein the at least one slot is in a center portion of the conductive line.

11. The flexible circuit substrate of claim 9, wherein the electrically conductive material includes at least one material selected from the group consisting of: graphene nanofibers, a plurality of graphene nanotubes, a plurality of graphene nanosheets, and a plurality of diamond nanothreads.

12. The flexible circuit substrate of claim 9, wherein a plurality of the at least one slot in the conductive line filled with the crack resistant material are aligned along a centerline of the conductive line.

13. The flexible circuit substrate of claim 9, wherein the at least one slot in the conductive line on the flexible substrate filled with the crack resistant material further comprises:
    more than one slot of the at least one slot in the conductive line are positioned around a centerline of the conductive line; and
    each slot of the more than one slot is an equal distance from the centerline of the conductive line.

14. The flexible circuit substrate of claim 9, wherein the electrically conductive material includes a copper seed layer.

15. The flexible circuit substrate of claim 1, wherein the plurality of slots in a bending area of the flexible substrate improves a flexible substrate yield during mechanical bending compared to a flexible substrate without the plurality of slots.

* * * * *